United States Patent
Kerber et al.

(10) Patent No.: US 9,379,219 B1
(45) Date of Patent: Jun. 28, 2016

(54) SIGE FINFET WITH IMPROVED JUNCTION DOPING CONTROL

(71) Applicant: International Business Machines Corporation, Armonk, NY (US)

(72) Inventors: Pranita Kerber, Mount Kisco, NY (US); Qiqing C. Ouyang, Yorktown Heights, NY (US); Alexander Reznicek, Troy, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/060,884

(22) Filed: Mar. 4, 2016

Related U.S. Application Data

(63) Continuation of application No. 14/583,837, filed on Dec. 29, 2014.

(60) Provisional application No. 61/976,012, filed on Apr. 7, 2014.

(51) Int. Cl.
  *H01L 29/72* (2006.01)
  *H01L 29/66* (2006.01)

(52) U.S. Cl.
  CPC .................. *H01L 29/66795* (2013.01)

(58) Field of Classification Search
  CPC .................................... H01L 29/66795
  USPC ............................................ 438/283; 257/192
  See application file for complete search history.

(56) References Cited

U.S. PATENT DOCUMENTS

| | | | | |
|---|---|---|---|---|
| 9,202,019 | B2* | 12/2015 | Xiao | G06F 21/10 |
| 2003/0227062 | A1* | 12/2003 | Horiuchi | H01L 21/823814 |
| | | | | 257/382 |
| 2015/0255606 | A1* | 9/2015 | Cheng | H01L 29/7848 |
| | | | | 257/192 |

* cited by examiner

*Primary Examiner* — Edward Wojciechowicz
(74) *Attorney, Agent, or Firm* — Cantor Colburn LLP; Vazken Alexanian

(57) ABSTRACT

A semiconductor device and a method for fabricating the device. The method includes: providing a FinFET having a source/drain region, at least one SiGe fin, a silicon substrate, a local oxide layer is formed on the silicon substrate, a gate structure is formed on the at least one SiGe fin and the local oxide layer, the gate structure is encapsulated by a gate hard mask and sidewall spacer layers; recessing the at least one SiGe fin in the source/drain region to the sidewall spacer layers and the silicon substrate layer; recessing the local oxide layer in the source/drain region to the sidewall spacer layer and the silicon substrate; growing a n-doped silicon layer on the silicon substrate; growing a p-doped silicon layer or p-doped SiGe layer on the n-doped silicon layer; and forming a silicide layer on the p-doped silicon layer or p-doped SiGe layer.

1 Claim, 4 Drawing Sheets

SIGE FINFET WITH IMPROVED JUNCTION DOPING CONTROL

PRIORITY

This application claims priority to U.S. Provisional Application No. 61/976,012, entitled "SiGe FINFET WITH IMPROVED JUNCTION DOPING CONTROL," filed Apr. 7, 2014, which in turn claims priority from U.S. Non-Provisional application Ser. No. 14/583,837 filed Dec. 29, 2014, which is incorporated herein by reference in its entirety.

BACKGROUND

The present invention relates to the field of semiconductor devices. More particularly, the present invention is related to a device and method for forming an extension in a FinFET device.

FinFET (Fin field-effect transistor) is a technology that allows for higher performance in smaller devices. A bulk FinFET structure includes a fin, a gate, and a source drain region. The structure has narrow bars of SiGe (silicon-germanium) fins with a gate or gates on either side of the fins. The gates can also be located on top of the fins. SiGe FinFET devices are designed to help reduce the threshold voltage and improve device performance. The source/drain region of the MOSFET (metal oxide semiconductor field-effect transistor) is doped by adding trace impurity elements into the substrate which allows the electrical properties to be altered. The source/drain region can be doped by either ion implantation or by merging the source/drain regions with an epitaxy layer and doping this epitaxy layer in-situ. After doping is complete, the bulk wafer is annealed for diffusion and activation of the dopant to form the source/drain and extension junctions. Doping with ion implantation causes fin damage and incomplete or no recrystallization upon annealing. This leads to defects and incomplete activation of the dopant, which in turn leads to higher leakage and higher access resistance, respectively. Boron is the common dopant for positive channel field effect transistor (pFET) devices. Diffusion of boron from merged epitaxy layer into the SiGe fins is extremely slow and can leave a significant portion of the SiGe fin undoped, thus leading to underlapped devices with very high access resistance. SiGe FinFET devices with overlapped junction and lower access resistance are a challenge as boron diffusion in SiGe is negligible.

SUMMARY

According to one aspect of the present invention, a method for fabricating a semiconductor device is provided. The method includes: providing a FinFET having a source/drain region and at least one SiGe fin, wherein the at least one SiGe fin has sidewalls and is formed on a silicon substrate, a local oxide layer is formed on the silicon substrate, a gate structure is formed on the at least one SiGe fin and the local oxide layer, the gate structure is encapsulated by a gate hard mask and a sidewall spacer layer; recessing the at least one SiGe fin in the source/drain region, wherein the at least one SiGe fin is recessed to the sidewall spacer layer and the silicon substrate layer; recessing the local oxide layer in the source/drain region, wherein the local oxide layer is recessed to the sidewall spacer layer and the silicon substrate; growing a n-doped silicon layer on the silicon substrate in the source/drain region; growing either a p-doped silicon layer or a p-doped SiGe layer on the n-doped silicon layer in the source/drain region; and forming a silicide layer on the p-doped silicon layer or the p-doped SiGe layer in the source/drain region.

According to another aspect of the present invention, a semiconductor device is provided. The device includes: a silicon substrate having a source/drain region; a local oxide layer formed on the silicon substrate; at least one SiGe fin formed on the silicon substrate, wherein the at least one SiGe fin includes an extension region; a gate structure formed on the local oxide layer and the extension region of the at least one SiGe fin, wherein the gate structure is encapsulated by sidewall spacer layers and a gate hard mask, the at least one SiGe fin extends vertically from the silicon substrate through the sidewall spacer; a n-doped silicon layer grown on the silicon substrate, wherein the n-doped silicon layer is grown in the source/drain region; a p-doped silicon layer or p-doped SiGe layer grown on the n-doped silicon layer, wherein the p-doped silicon layer or p-doped SiGe layer is grown in the source/drain region; and a silicide layer formed on the p-doped silicon layer or the p-doped SiGe layer, wherein the silicide layer is formed in the source/drain region.

DETAILED DESCRIPTION

With continued device pitch scaling, access resistance is becoming a barrier to improving device performance. In this scenario, achieving junction overlap and reducing extension resistance are crucial to improving device performance. According to an embodiment of the present invention, a method for forming extensions in a SiGe FinFET structure with abrupt junctions is provided. The resulting structure has improved short-channel control and lower access resistance.

Figure 5:
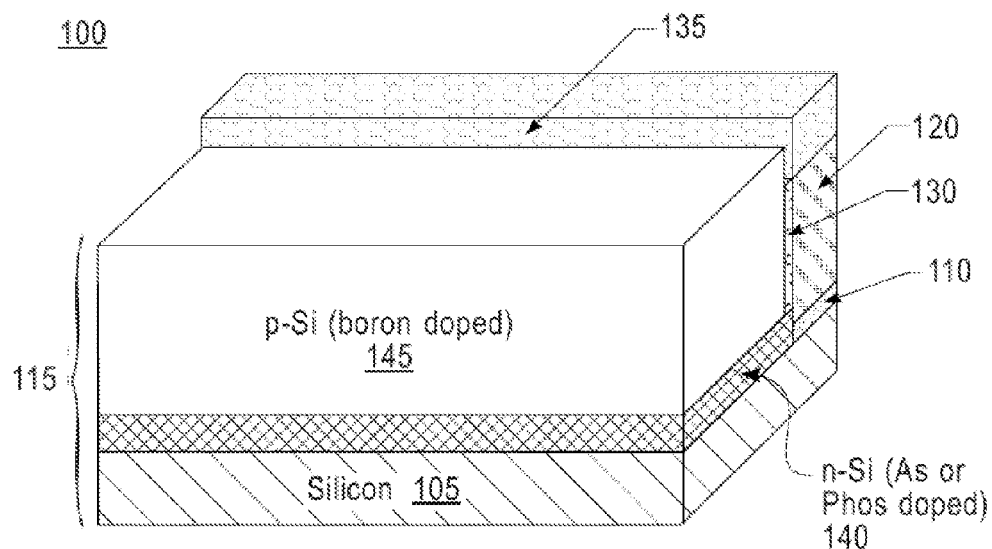
FIG. 5 is a three dimensional isometric view of a semiconductor device with SiGe pFET fins, according to an embodiment of the present invention, after a p-doped layer is grown on the n-doped silicon layer.
Figure 6:
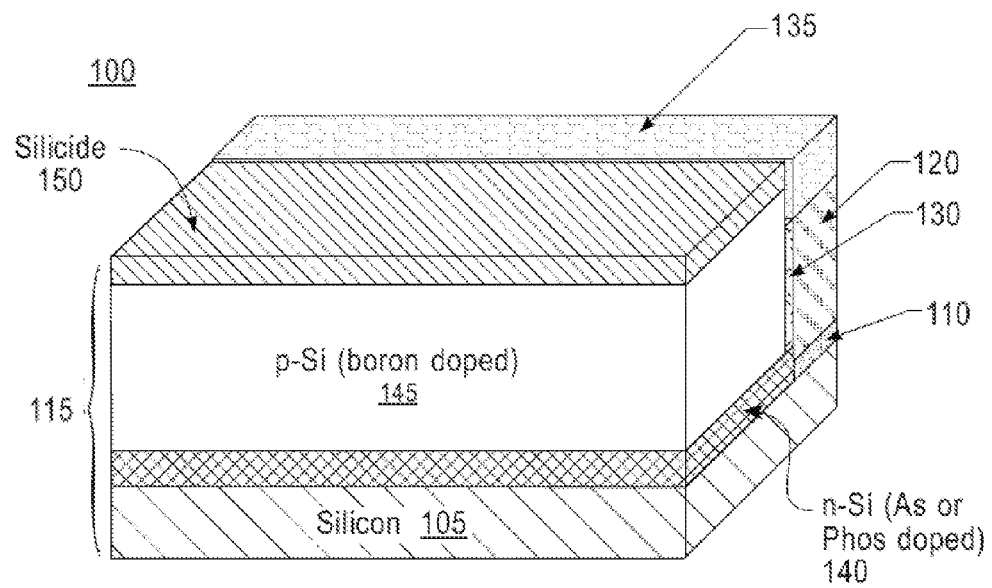
FIG. 6 is a three dimensional isometric view of a semiconductor device with SiGe pFET fins, according to an embodiment of the present invention, after a silicide layer is formed on the p-doped layer.
Figure 7:
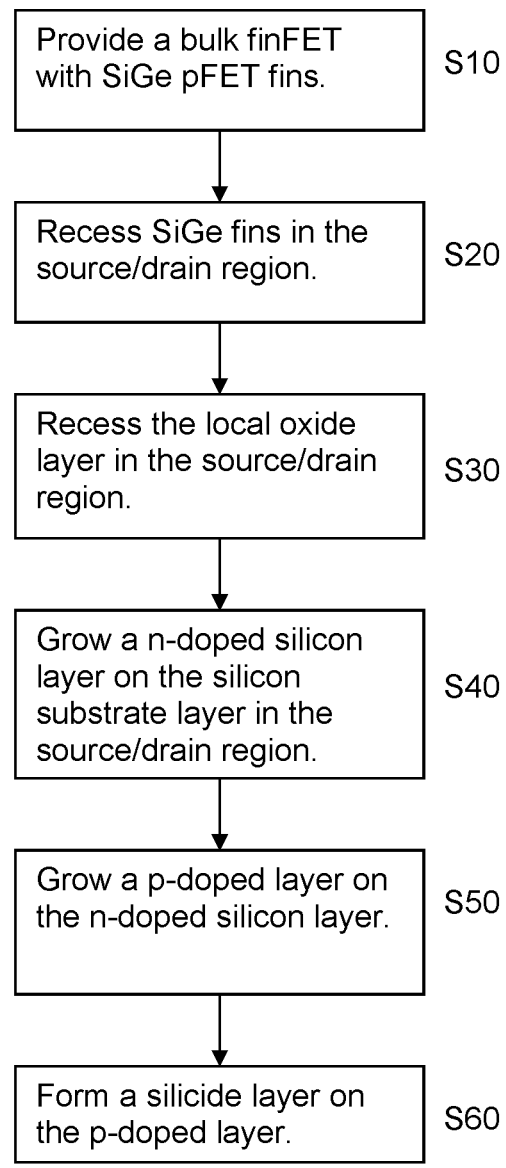
FIG. 7 is a flowchart depicting a method for fabricating a semiconductor device with SiGe pFET fins, according to an embodiment of the invention.

According to an embodiment of the present invention, FIGS. 1-6 depict three dimensional isometric views of a semiconductor device after the operations of a method for fabricating the device, as depicted in FIG. 7, are performed. However, the present invention can be implemented in various manners, and thus should not be to be limited to the embodiments disclosed herein.

SiGe fins for pFETs are the proposed solution for pFETs in 10 nm and beyond. Short-channel control of the p-type doping profile, usually boron, and junctions at those small dimensions are very challenging, since diffusion of boron in SiGe is negligible. In a pFET, doping of the silicon includes a hole being formed due to the absence of an electron in a covalent bond state. The missing electron would normally be part of the bond between one silicon atom and its neighbor. Doping can be accomplished with a p-type impurity, for example, boron, being added to the silicon. The junction between the p-type and n-type doped regions (referred to as a p-n junction) permits the silicon to function as a semiconductor device.

According to an embodiment of the present invention, the semiconductor device includes a SiGe fin under the gate structure and silicon or SiGe in the source/drain regions. A conventional fabrication process of pFET FinFET with a SiGe fin under the gate structure and silicon in the source/drain region leaves devices underlapped because of low diffusion of boron in SiGe. This leads leaves the fins substantially undoped, causing the access resistance to be very high. SiGe fins are desired in FinFETs for their lower threshold voltage, higher hole mobility, and better device performance. Underlapped devices are structures where the extension doping is lower (typically lower than $1e^{19}/cm^3$) at the gate-edge. Underlapped devices are not desirable because the device-to-device or bulk wafer-to-wafer variability degrades in addition to the higher access resistance. A desired structure has a junction in semiconductor under the spacer region of the fin, leading to overlapped, abrupt extension junctions with low access resistance. Overlapped devices are the ones where extension doping is $1e^{19}/cm^3$ or higher at the gate edge. According to an embodiment of the present invention, an overlapped semiconductor device is formed with an abrupt junction at the gate edge. Additionally, the fins in the source drain regions can be doped, which can help in reducing the access resistance of the MOSFET further.

Figure 1:
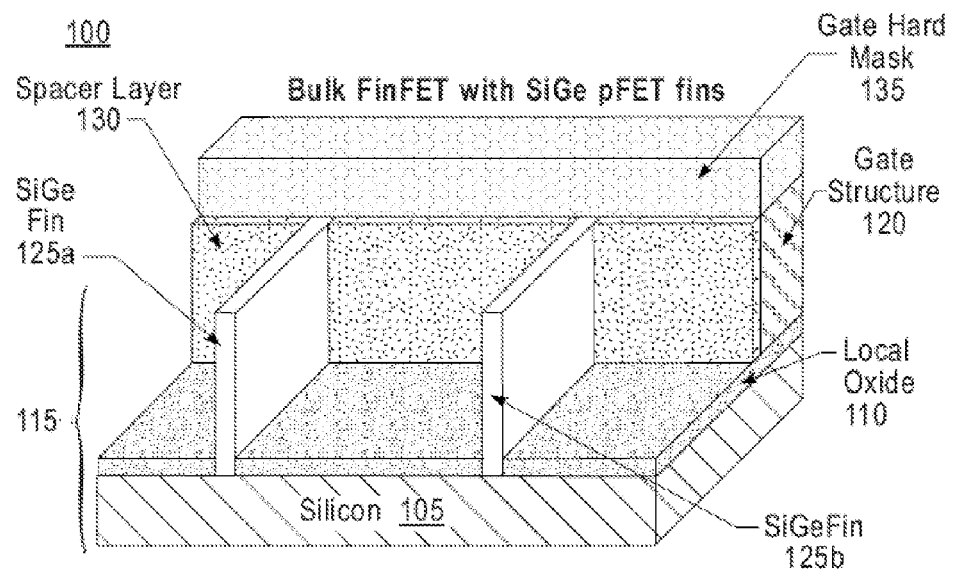
FIG. 1 is a three dimensional isometric view of a bulk FinFET with a SiGe pFET fin that can be found in the prior art.

Referring to FIGS. 1 & 7, FinFET device 100 with SiGe pFET fins 125a and 125b is provided in operation S10. FinFET device 100 includes a bulk silicon substrate layer 105, a local oxide layer 110, and a source/drain region 115. FinFET device 100 further includes SiGe fins 125a and 125b, gate structure 120, spacer layer 130, and gate hard mask 135. As depicted in FIG. 1, SiGe fins 125a and 125b are formed on bulk silicon substrate layer 105. Local oxide layer 110 is also formed on the portions of bulk silicon substrate layer 105 adjacent to SiGe fins 125a and 125b. Gate structure 120 is formed on local oxide layer 110 and SiGe fins 125a and 125b so that SiGe fins 125a and 125b are under gate structure 120 and extend to a source/drain region on the other side of gate structure 120 (not shown). Spacer layer 130 is formed on the sides of gate structure 120. Spacer layer 130 can be made of silicon oxide or silicon nitride or silicon oxynitride or a combination thereof. Gate hard mask 135 is formed on top of gate structure 120. Gate hard mask 135 can be made of the same or different material as spacer layer 130. If the same material is used for gate hard mask 135 and spacer layer 130, then the density of the gate hard mask can be different than that of the spacer layer.

Gate structure 120 can also include a thin layer of gate dielectric (not shown). The gate dielectric can be a layer of oxide or nitride or it can be a layer of a high dielectric constant (high-k) material including a dielectric metal oxide and having a dielectric constant that is greater than the dielectric constant of silicon nitride of 7.5. The high-k dielectric layer can be formed by methods well known in the art including, for example, chemical vapor deposition (CVD), atomic layer deposition (ALD), molecular beam deposition (MBD), pulsed laser deposition (PLD), liquid source misted chemical deposition (LSMCD), etc. The dielectric metal oxide includes a metal and oxygen, and optionally nitrogen and/or silicon. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the high-k dielectric layer can be from 1 nm to 10 nm, and more preferably from about 1.5 nm to about 3 nm. The high-k dielectric layer can have an effective oxide thickness (EOT) on the order of, or less than, about 1 nm. A gate electrode can be deposited directly on the surface of the high-k dielectric layer by, for example, chemical vapor deposition (CVD), physical vapor deposition (PVD), or atomic layer deposition (ALD).

Source/drain region 115 can be doped by ion implantation. This is accomplished by merging source/drain regions 115 with an epitaxy layer and doping this epitaxy layer in-situ, or by combining the in-situ doped epitaxy process with single or multiple ion implantations. In an epitaxial growth process, a semiconductor material can be grown on the surface of another semiconductor material. Both semiconductor materials have the same crystalline characteristics. Epitaxy can include the formation of a layer on a crystalline surface, with the layer having the same symmetry and crystalline orientation as the crystalline surface. A single crystal lattice structure often carries across an interface. In epitaxy, a single crystal or monocrystalline material forms a platform onto which another single crystal material with matching crystalline characteristics is deposited by one of several techniques. Examples of such processes include: ultrahigh vacuum chemical vapor deposition (UHVCVD), rapid thermal chemical vapor deposition (RTCVD), metal-organic chemical vapor deposition (MOCVD), low-pressure chemical vapor deposition (LPCVD), limited reaction processing chemical vapor deposition (LRPCVD), plasma-enhanced chemical vapor deposition (PECVD), and molecular beam epitaxy (MBE).

The terms "p-doped silicon" or "p-doped SiGe," as used herein, refer to silicon or SiGe having substitutional acceptor atoms located therein, respectively. The substitutional acceptor atoms and the silicon or SiGe atoms form a silicon-dopant or SiGe-dopant alloy, which is a semiconductor material. The dopant content of the epitaxial grown p-doped layers range from 0.02% to 0.1%, by atomic weight %. As in the embodiment depicted in FIG. 1, examples of acceptor dopants include Boron (B), Difluoroborane ($BF_2$), and Indium (In), and the dopant concentration can be on the order of about $10^{19}$ atoms/$cm^3$, such as a dopant concentration of about $1 \times 10^{19}$ to $5 \times 10^{20}$ atoms/$cm^3$, as examples of p-doped Si or p-doped SiGe dopants and concentrations.

Ion implantation can cause fin damage and incomplete or no recrystallization upon annealing. This leads to defects and incomplete activation of the dopant, which in turn leads to higher leakage and higher access resistance, respectively. To circumvent this problem, an implant-free approach can be exercised. After depositing the in-situ p-doped Si or p-doped SiGe epitaxy layer, the wafer can be annealed for diffusion and activation of the dopant to allow for formation of source/drain region 115 and the extension junctions of SiGe fins 125a and 125b. Extension junctions (not shown) are part of SiGe Fins 125a and 125b and are formed under spacer layer 130 and gate structure 120.

Figure 2:
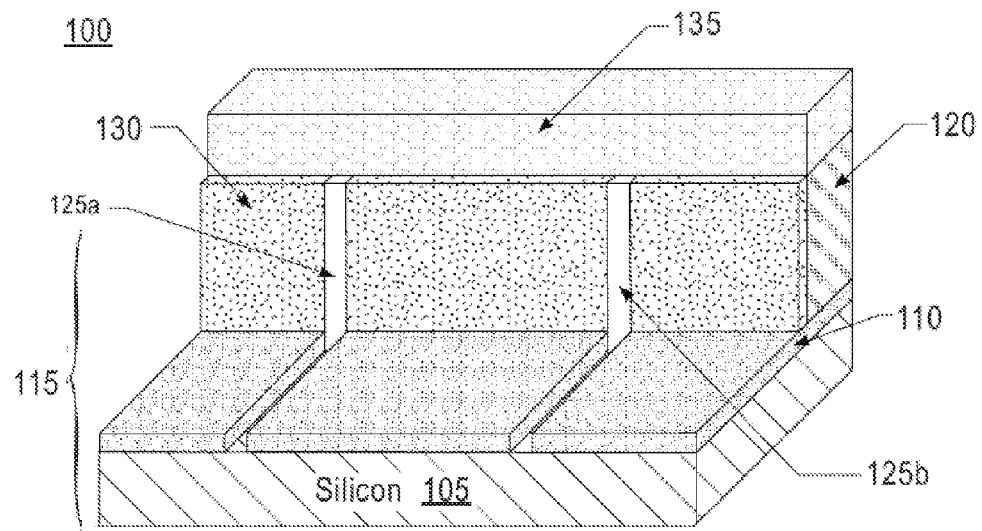
FIG. 2 is a three dimensional isometric view of a semiconductor device with SiGe pFET fins, according to an embodiment of the present invention, after the SiGe fins are recessed.

Referring to FIGS. 2 & 7, FinFET device 100 is depicted after operation S20 is completed. In operation S20, SiGe fins 125a and 125b are recessed to spacer layer 130 and to bulk silicon substrate layer 105. This creates an exposed region of bulk silicon substrate layer 105. A dry plasma etch process, such as reactive ion etch (RIE) process, is one suitable technique to recess the fins using an etch chemistry that is selective to Si (e.g., $CF_4$), or similar industry process. As depicted in FIG. 2, SiGe fins 125a and 125b are recessed to spacer layer 130 that encapsulates the sides of gate structure 120 forming a flat vertical wall including both SiGe fins 125 and spacer layer 130. SiGe fins 125a and 125b form an abrupt junction on bulk silicon substrate layer 105 in the silicon component of the fins. After SiGe fins 125a and 125b are recessed, a canal-like region is formed in local oxide layer 110. Bulk silicon substrate layer 105 is exposed by these canal-like regions.

The recessed SiGe fins 125a and 125b and bulk silicon substrate layer 105 form abrupt junctions upon source/drain epitaxy formation, which is desirable for improved short-channel control. Abrupt junctions reduce both the drain-induced barrier lowering (DIBL), and the sub-threshold slope (SSsat) of the device both of which lead to improved drive current and performance.

Figure 3:
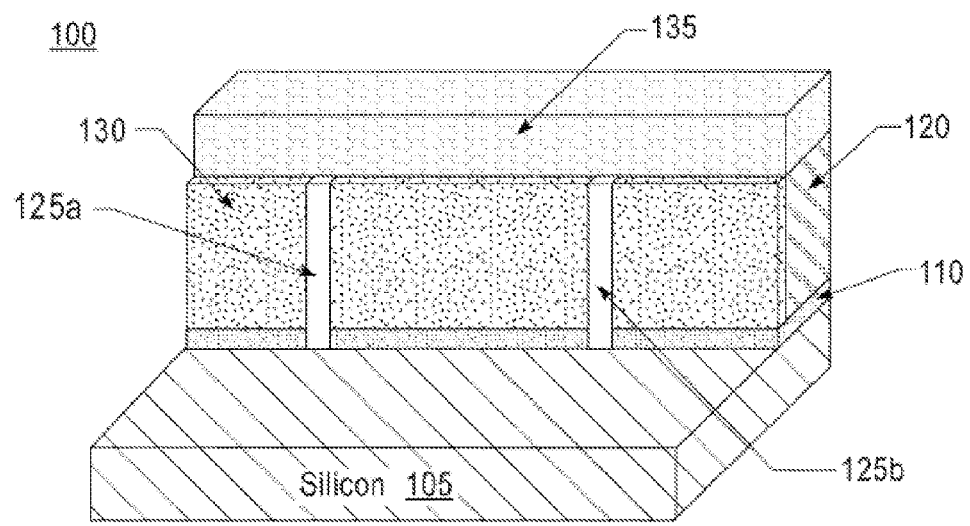
FIG. 3 is a three dimensional isometric view of a semiconductor device with SiGe pFET fins, according to an embodiment of the present invention, after the local oxide layer in the source/drain region is recessed.

Referring to FIGS. 3 & 7, FinFET device 100 is shown following the completion of operation S30. In operation S30, local oxide layer 110 in source/drain region 115 is recessed to spacer layer 130. This forms a flat, vertical wall, which includes SiGe fins 125a and 125b, spacer layer 130, and local oxide layer 110, as shown in FIG. 3. A dry plasma etch process, such as a reactive ion etch (RIE), is one suitable technique to recess local oxide layer 110 using an etch chemistry that is selective to Si (e.g., $CF_4$), or similar industry process. Recessing local oxide top layer 110 leaves bulk silicon substrate layer 105 exposed in source/drain region 115.

Figure 4:
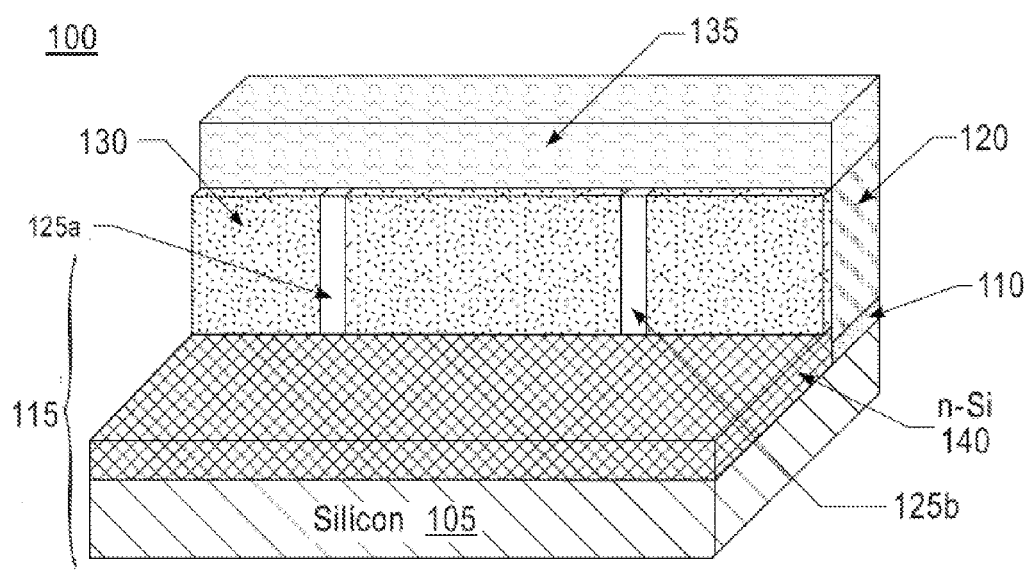
FIG. 4 is a three dimensional isometric view of a semiconductor device with SiGe pFET fins, according to an embodiment of the present invention, after a n-doped silicon layer is grown on the silicon substrate layer in the source/drain region.

Referring to FIGS. 4 & 7, FinFET device 100 is depicted after operation S40 is performed. In operation S40, an n-doped silicon layer 140 is grown on top of bulk silicon substrate layer 105 in source/drain region 115. N-doped silicon layer 140 is formed directly on top of bulk silicon substrate layer 105, creating a contact between the bottom side of n-doped silicon layer 140 and the top side of bulk silicon substrate layer 105, as depicted in FIG. 4. N-doped silicon layer 140 isolates source/drain region 115 and helps prevent excessive leakage during the device-off state in short channel lengths devices. Punch through occurs between the source and drain of a device when parasitic leakage path occurs deep in the transistor body that is poorly controlled by the gate. This phenomenon is undesirable as it increases the subthreshold leakage there by increasing the stand-by power consumption for the same performance. N-doped silicon layer 140 can be grown to ~10-30 nm thick and have low to mid-e18/$cm^3$ n-type doping level. The doping level can be done by either using arsenic, phosphorus, or any method known in the art.

Still referring to FIGS. 4 & 7, after n-doped silicon layer 140 has been grown bulk silicon substrate layer 105, n-doped silicon is etched from the sidewalls of SiGe fins 125a and 125b. Further etching occurs under gate structure 120 to better form the extensions under spacer layer 135. A hydrochloric acid (HCl) etch process can be used to etch the sidewalls of SiGe fins 125a and 125b and under gate structure 120. The fabricator can then diffuse and activate the dopant in the region under the spacer to ensure a well overlapped junction with low extension resistance.

Referring to FIGS. 5 & 7, FinFET device 100 is shown following after operation S50 has been performed. In operation S50, p-doped silicon layer 145 is grown on n-doped silicon layer 140, as shown in FIG. 5. As an alternative to growing a p-doped silicon layer, a p-doped SiGe layer can be grown on n-doped silicon layer 140. P-doped silicon layer 145 is formed directly on top of n-doped silicon layer 140. A contact is formed between the bottom side of p-doped silicon layer 145 and the top side of n-doped silicon layer 140. Doping of n-doped silicon layer 140 must be done prior to p-doped silicon layer 145 being grown. P-doped silicon layer 145 is doped typically using boron to a 2-4$e^{20}$/$cm^3$ boron doping level. With trisilane or tetrasilane, high boron doping level at low temperatures (~550° C.) can be achieved. Low epitaxy growth temperature is desirable to maintain SiGe fin strain.

Referring to FIGS. 6 & 7, FinFET device 100 is shown following the completion of operation S60. In operation S60, silicide layer 150 is formed on p-doped silicon layer 145, creating a contact between the bottom side of silicide layer 150 and the top side of p-doped silicon layer 145, as depicted in FIG. 6. Silicide layer 150 can also be formed on top of epitaxially grown n-situ boron doped SiGe on top of p-doped Si source/drain regions. If an in-situ doped SiGe layer is deposited before the silicide process, additional sourced/drain recess can be necessary. This additional recess can be performed by RIE.

The resulting structure includes a pFET FinFET with SiGe fins 125a and 125b formed under gate structure 120. Source/drain region 115 of the FinFET includes n-doped silicon layer 145 grown on bulk silicon substrate layer 105, p-doped silicon layer 145 grown on n-doped silicon layer 140, and silicide layer 150 formed on p-doped silicon layer 145. As an alternative, a p-doped SiGe layer can be formed instead of p-doped silicon layer 145.

The description of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a semiconductor device, the method comprising:

providing a FinFET having a source/drain region and at least one SiGe fin, wherein the at least one SiGe fin has sidewalls and is formed on a silicon substrate layer, a local oxide layer is formed on the silicon substrate layer, a gate structure is formed on the at least one SiGe fin and the local oxide layer, the gate structure is encapsulated by a gate hard mask and a plurality of sidewall spacer layers;

recessing the at least one SiGe fin in the source/drain region, wherein the at least one SiGe fin is recessed to the plurality of sidewall spacer layers and the silicon substrate layer;

recessing the local oxide layer in the source/drain region, wherein the local oxide layer is recessed to the plurality of sidewall spacer layers and the silicon substrate layer;

growing an n-doped silicon layer having a thickness between 10 and 30 nm on the silicon substrate layer in the source/drain region, wherein growing an n-doped silicon layer on the silicon substrate layer comprises etching the n-doped silicon layer with an HCl etch from the at least one SiGe fin sidewalls;

etching under the plurality of sidewall spacer layers and the gate structure;

growing either a p-doped silicon layer or a p-doped SiGe layer having a thickness between 40 and 50 nm on the n-doped silicon layer in the source/drain region using tetrasilane or trisilane at a temperature of about 550° C., wherein the p-doped silicon layer or the p-doped SiGe layer comprises boron at a concentration of about $10^{19}$ atoms/cm3; and forming a silicide layer on the p-doped silicon layer or the p-doped SiGe layer in the source/drain region.

\* \* \* \* \*